United States Patent [19]

Ihara et al.

[11] 4,282,543
[45] Aug. 4, 1981

[54] SEMICONDUCTOR SUBSTRATE AND METHOD FOR THE PREPARATION OF THE SAME

[75] Inventors: Masaru Ihara; Masayuki Jifuku, both of Kawasaki, Japan

[73] Assignee: Fujitsu Limited, Kanagawa, Japan

[21] Appl. No.: 95,783

[22] Filed: Nov. 19, 1979

Related U.S. Application Data

[63] Continuation of Ser. No. 815,784, Jul. 14, 1977, abandoned.

[30] Foreign Application Priority Data

Jul. 30, 1976 [JP] Japan .................................. 51/91528

[51] Int. Cl.³ ..................... H01L 29/34; H01L 29/78; H01L 27/12
[52] U.S. Cl. ..................................... 357/54; 357/23; 357/49; 357/80; 29/580
[58] Field of Search ..................... 357/23, 26, 42, 49, 357/54, 80; 29/580

[56] References Cited

U.S. PATENT DOCUMENTS

| | | | |
|---|---|---|---|
| 3,393,088 | 7/1968 | Manasevit | 357/80 |
| 3,602,981 | 9/1971 | Kool | 357/23 |
| 3,695,956 | 10/1972 | Speers | 357/49 |
| 3,749,614 | 7/1973 | Boleky et el. | 357/42 |
| 3,922,705 | 11/1975 | Yerman | 357/26 |
| 3,997,381 | 12/1976 | Wanlass | 357/54 |
| 4,050,979 | 9/1977 | Smeltzer et al. | 29/580 |

*Primary Examiner*—Andrew J. James
*Attorney, Agent, or Firm*—Staas & Halsey

[57] ABSTRACT

An improved semiconductor substrate comprises at least one insulating layer comprising (a) a thin film of amorphous silicon dioxide formed on a base plate comprising single crystal silicon and (b) a thin film of single crystal sapphire superimposed on the silicon dioxide film. A semiconductor substrate may be prepared by forming a first thin film of single crystal sapphire on a base plate comprising single crystal silicon, converting, if desired, the upper surface layer of the silicon base plate into a first thin film of amorphous silicon dioxide by thermal oxidation through the sapphire film, forming a second thin film comprising single crystal silicon on the first sapphire film, forming a second thin film comprising single crystal sapphire on the second silicon film, and then thermally oxidizing the second silicon film through the second sapphire film to form a second film comprising amorphous silicon dioxide.

13 Claims, 7 Drawing Figures

SEMICONDUCTOR SUBSTRATE AND METHOD FOR THE PREPARATION OF THE SAME

This application is a continuation of U.S. Application Ser. No. 815,784 filed July 14, 1977 now abandoned.

BACKGROUND OF THE INVENTION

1. Field of the Invention

The present invention relates to a semiconductor substrate and to a method for its preparation. More particularly, the present invention relates to a silicon-on-sapphire (SOS) type semiconductor substrate and to a method for its preparation.

2. Description of the Prior Art

Because the small parasitic capacity of the silicon-on-sapphire structure enables the semiconductor device to increase its switching speed, studies concerning application of the silicon-on-sapphire type semiconductor device to practical uses are nowadays being actively developed. The conventional SOS type semiconductor substrate comprises base plate of a bulk sapphire and a crystalline silicon layer formed on the bulk sapphire base plate. However, this conventional SOS type semiconductor substrate has the following disadvantages.
1. The bulk sapphire is expensive.
2. Since there is a mismatch between the crystal structure of the sapphire and the crystal structure of the silicon to be applied onto the sapphire, it is difficult to grow a good quality crystalline silicon film on the sapphire base plate.

SUMMARY OF THE INVENTION

In order to eliminate the above-mentioned disadvantages of the conventional SOS type semiconductor substrate, an improved semiconductor substrate was prepared by forming, from the gas phase, a film of single crystal sapphire on a base plate of silicon which is much cheaper than the bulk sapphire, and forming, from the gas phase, a film of a single silicon crystal on the sapphire film. The desired semiconductor elements can be formed on or in the single silicon crystal film of the above-mentioned semiconductor substrate. However, the above-mentioned type of semiconductor substrate exhibited the problems or disadvantages which are described below.

In the case where the single-crystal sapphire film has a thickness of 2 μm or less, the sapphire film has an undesirably high dielectric constant of, for example, 9 to 10, and an undesirably large parasitic capacity. Therefore, in the above-mentioned case, in spite of the utilization of the expensive sapphire film, there are no advantages which can be anticipated from the use of such a sapphire film.

The above-mentioned problem can be eliminated by increasing the single-crystal sapphire film to a thickness larger than 2 μm. However, the increase in the thickness of the sapphire film to larger than 2 μm results in the formation of a very apparent rough surface having a scale-like pattern on the sapphire film, which scale-like pattern is a characteristic of the sapphire film formed by way of hetero-epitaxy.

Furthermore, the large thickness of the sapphire film frequently results in the formation of cracks in the sapphire film due to differences in the coefficient of thermal expansion, in Young's modulus and in the hardness between the sapphire film and the silicon film. For example, the coefficient of thermal expansion of single-crystal silicon film is $3.57 \times 10^{-6}$ cm/°C., whereas the coefficient of thermal expansion of single-crystal sapphire film is $8.40 \times 10^{-6}$ cm/°C. This difference in the coefficient of thermal expansion between the film of single-crystal silicon and the film of single-crystal sapphire crystal results in a spontaneous curvature of a semiconductor substrate comprising of the above-mentioned films superimposed on each other. When a semiconductor substrate is subjected to a photographic process to form desired images on the substrate, the curvature of the substrate results in the formation of an unclear pattern of the images on the substrate. The problems mentioned above should be overcome in order to increase the degree of integration of the circuit elements in an integrated circuit semiconductor device.

An object of the present invention is to provide a semiconductor substrate which can be prevented from spontaneous curvature thereof, and to provide a method for the preparation of the semiconductor substrate.

Another object of the present invention is to provide a semiconductor substrate which prevents the formation of cracks in the sapphire film thereon, and to provide a method for its preparation.

Still another object of the present invention is to provide a semiconductor substrate having a negligibly small parasitic capacity even if the thickness of the sapphire film therein is smaller than 2 μm.

The above-mentioned objects can be accomplished by using the semiconductor substrate of the present invention which comprises (A) a base plate comprising single crystal silicon and (B) at least one insulating layer located on the base plate and composed of (a) a lower film of amorphous silicon dioxide facing the base plate, and (b) an upper film of single crystal sapphire formed on the amorphous silicon dioxide lower film.

The above-mentioned semiconductor substrate can be produced by using the method of the present invention by epitaxially growing a film of single crystal sapphire on the upper surface of a base plate comprising of single crystal silicon and applying a thermal oxidation process to the upper surface layer of the base plate through such sapphire film to form a film of amorphous silicon oxide.

In the case where the semiconductor substrate has two or more insulating layers, a first insulating layer comprising a first amorphous silicon dioxide lower film and a first film of single crystal sapphire can be prepared by using the above-mentioned method. Thereafter, a second insulating layer can be prepared on the first insulating layer by using the method in which a second lower film of single crystal silicon is formed on the first sapphire upper film, a second upper film of single crystal sapphire is formed on the second silicon lower film, and, then, a thermal oxidation process is applied to the second silicon lower film through the second sapphire upper film. A additional insulating layers may be formed on the second insulating layer by the same method as that used for the preparation of the second insulating layer.

The semiconductor substrate of the present invention can contain a film comprising single crystal sapphire located between the silicon base plate and the amorphous silicon dioxide lower film of the insulating layer. This type of semiconductor substrate can be prepared by using the method of the present invention, which comprises forming a first film of single crystal sapphire on the upper surface of a base plate of single crystal silicon, forming a film consisting of single crystal silicon on the upper surface of the first sapphire film, forming a second film of single crystal sapphire on the silicon film, and applying a thermal oxidation process to the silicon film through the second sapphire to form a film of amorphous silicon dioxide.

Further features and advantages of the present invention will be apparent from the following description, with reference being made to the accompanying drawings.

DESCRIPTION OF THE PREFERRED EMBODIMENTS

Figure 1:
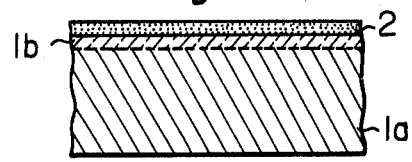
FIGS. 1 through 5 respectively show the step-by-step development of the method of the present invention.

The sapphire film can be formed by of epitaxial growth (orientated overgrowth) of the single crystal sapphire. The single crystal sapphire can be produced by a vapor phase reaction between aluminum, hydrogen chloride and carbon dioxide in an atmosphere containing hydrogen gas and nitrogen gas at a temperature of from 1,000° to 1,270° C. The thus produced film of the single-crystal sapphire has a thickness of several thousand angstroms (Å), for example, from 1,000 to 20,000 angstroms.

The silicon film can be formed by way of epitaxial growth of a silicion single crystal which can be produced by, for example, a vapor phase thermal decomposition of monosilane in a hydrogen gas atmosphere at a temperature of from 950° to 1,100° C. The silicon film thus produced has a thickness of from 500 to 10,000 angstroms.

The conversion of the single-crystal silicon layer or film into the amorphous silicon dioxide film can be effected by thermal oxidation in a molecular oxygen-containing atmosphere at a temperature of from 1,000 to 1,200° C. The resultant amorphous silicon dioxide film has a thickness of from 1,000 to 20,000 angstroms. The molecular oxygen-containing atmosphere may contain wet oxygen, wet nitrogen or dry oxygen.

All of the silicon film or layer may be converted into the silicon dioxide film. Or, a mask having a predetermined pattern may be placed on the sapphire film and the silicon film or layer may be locally thermally oxidized in accordance with the pattern of the mask. The mask may comprise, for example, silicon nitride.

In order to produce the semiconductor device according to the present invention, a layer of single crystal silicon is formed on the uppermost film of the semiconductor substrate by way of, for example, vapor phase epitaxial growth as mentioned above. The silicon layer has a thickness of from several thousand to several ten thousand angstroms, for example, from 3,000 to 30,000 angstroms. Accordingly, the desired semiconductor elements are formed in or on the silicon layer. As a result of the process of the present invention, each single crystal layer of sapphire, and the final layer of single crystal silicon, all may be said to have an epitaxial relation with each other and with the single crystal silicon base plate, since each successive single crystal layer is formed by expitaxial growth on the underlying single crystal layer.

In the present invention, the sapphire film is utilized only in order to form thereon the film of the single silicon crystal which is usually produced by epitaxy. Accordingly, it is not required that the sapphire film itself have a larger thickness of more than 2 μm which will result in a relatively small parasitic capacity. That is, the sapphire film in the semiconductor substrate of the present invention can have a small thickness of 1 μm or less which will result in the formation of a smooth surface on the sapphire film. The amorphous silicon dioxide film which has been produced by applying the thermal oxidation process to the single-crystal silicon film through a sapphire film, has a dielectric constant of from 3 to 4. Accordingly, the silicon dioxide film has the effect of reducing the parasitic capacity by 2 or more times from that of the sapphire film. That is, a silicon dioxide film having a thickness of 1 μm has the same effect in the reduction of parasitic capacity as that of a sapphire film having a thickness of from 3 to 5 μm. Furthermore, since the semiconductor substrate can contain a plurality of silicon dioxide films, it is possible to produce a semiconductor substrate having a negligibly small parasitic capacity. Examples of the present invention will be illustrated below with reference to the accompanying drawings.

Referring to FIG. 1, a first film 2 of single crystal sapphire having a thickness of several thousand Å is formed on the upper surface of a base plate 1a of single crystal silicon by epitaxy. Then, a thermal oxidation process may be applied to an upper surface layer 1b of the base plate through the sapphire film 2 to convert it into a first film of amorphous silicon dioxide. Or, the upper surface layer 1b may be left unoxidized.

Figure 2:
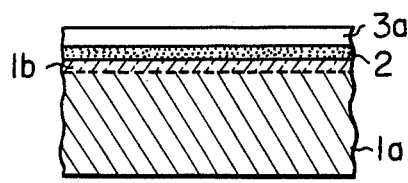

Referring to FIG. 2, a second film 3a of single crystal silicon and having a thickness of 1 μm or less is formed on the sapphire film 2, by way of, for example, epitaxy.

Figure 3:
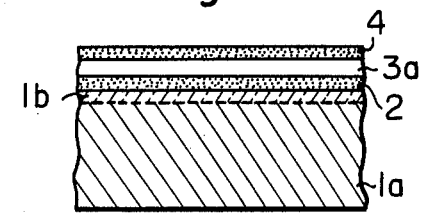
Figure 4:
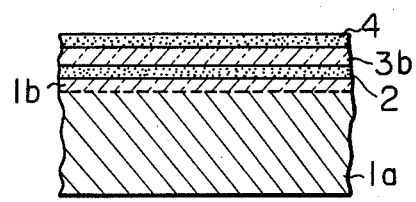

Referring to FIG. 3, a second film 4 of single crystal sapphire having a thickness of several thousand Å is formed on the silicon film 3a. Thereafter, referring to FIG. 4, the silicon film 3a is converted into a film 3b of amorphous silicon dioxide. This conversion can be effected by heat-treating the composite material of FIG. 3 in a wet oxygen atmosphere at a temperature of 1000° C. under an ambient pressure for a period of from 1 to 5 hours. Accordingly, a semiconductor substrate is obtained.

Figure 5:
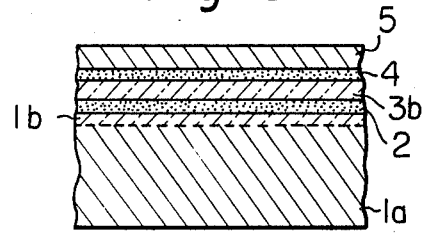

Referring to FIG. 5, a layer 5 of single crystal silicon having a thickness of several microns is formed on the second sapphire film 4 by way of epitaxy. Accordingly, desired semiconductor elements can be formed on or in the silicon layer 5.

Figure 6:
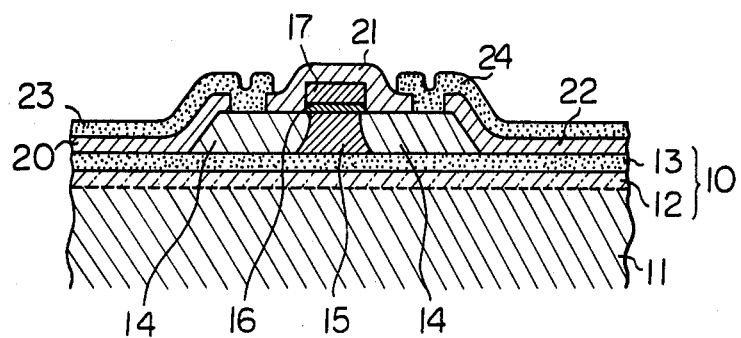
FIG. 6 is an explanatory cross-sectional view of a semiconductor device in which a substrate of the present invention is utilized therein.
Figure 7:
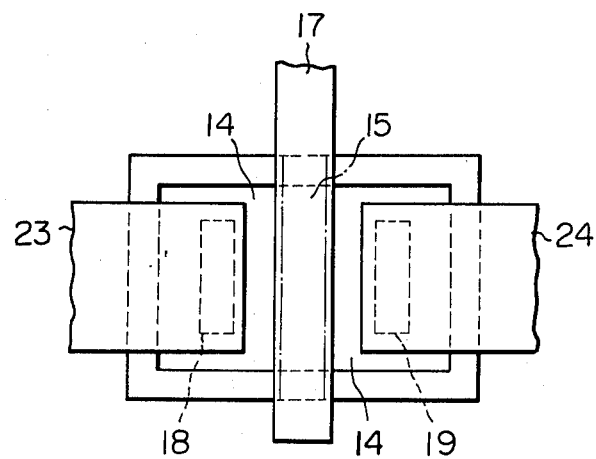
FIG. 7 is a plan view of the semiconductor device shown in FIG. 6.

The semiconductor substrate can be utilized as a substrate of, for example, an insulated gate field effect transistor (metal-insulator-semiconductor). Referring to FIGS. 6 and 7, an insulating layer 10 of a film 12 of amorphous silicon dioxide and a film 13 of single crystal sapphire is formed by way of epitaxy on a base plate 11 of single crystal silicon, and a layer 14 consisting of single crystal silicon is formed by epitaxy on the insulating layer 10. The silicon layer 14 contains therein and thereon a P region 15 of boron-doped silicon, a gate insulating film 16, a gate electrode 17 of polycrystals of silicon, contact windows 18 and 19, phosphosilicate glass films 20, 21 and 22, an electricity source electrode 23 of aluminum, and a drain electrode 24 of aluminum.

Generally, a plurality of the insulated gate field effect transistors are located on the same semiconductor substrate, and the transistors are connected to each other through aluminum wiring layers so as to form a complicated integrated circuit having multiple electric functions. The device of FIGS. 6 and 7 is of a silicon gate type. However, the semiconductor substrate of the present invention is usable for an aluminum gate type of semiconductor device.

In the device of FIGS. 6 and 7, the layer of a single crystal of silicon is in the form of a plurality of islands. Usually, the gate insulating film 16 has a thickness of about 1000 Å. The thickness of the silicon layer 14, the electrodes 23 and 24, the phosphosilicate glass films 20, 21 and 22 and the polycrystalline silicon gate electrode 17 are in a range of from 0.5 to 1.0 μm. The semiconductor substrate of the present invention is also usable for bipolar integrated circuits, for example, bipolar transistors.

The semiconductor substrate is resistant to the spontaneous formation of a curvature thereof because the silicon dioxide film which has a relatively small coefficient of thermal expansion is interposed between two sapphire films having a relatively large coefficient of thermal expansion or between a sapphire film and a silicon base plate both of which have a relatively large coefficient of thermal expansion, respectively. The above-mentioned superimposed structure of a plurality of component layers is effective for absorbing the stresses created in the interfaces between the component layers. The semiconductor substrate of the present invention has a significantly small parasitic capacity, a high crystallinity, a sapphire film with a very small thickness and a smooth upper surface on the substrate. Accordingly, the semiconductor substrate is also highly resistant to the formation of cracks and rough surfaces. Accordingly, the layer of single crystal silicon formed on the substrate of the present invention has excellent qualities in surface morphology and electric properties. Therefore, the semiconductor elements formed in or on the silicon layer also have excellent qualities in breakdown voltage and switching speed. Furthermore, the semiconductor substrate of the present invention is effective for increasing integration of circuit elements in a semiconductor device and for decreasing the production cost of the semiconductor device.

What we claim is:

1. A semiconductor substrate suitable for a semiconductor device, said substrate comprising
a base plate of single crystal silicon,
at least one insulating layer located on said base plate, each said insulating layer comprising a lower film comprising amorphous silicon dioxide facing said base plate and an upper film comprising single crystal sapphire located on said amorphous silicon dioxide lower film, said upper film having an epitaxial relation with said base plate, and
a layer comprising single crystal silicon on the uppermost one of said at least one upper film, said single crystal silicon layer having an epitaxial relation with said uppermost one of said at least one upper film.

2. The substrate of claim 1 comprising a film of single crystal sapphire located between said base plate and said insulating layer on said base plate.

3. The substrate of claim 1, wherein said amorphous silicon dioxide lower film of said insulating layer on said base plate comprises an upper surface portion of said silicon base plate, which upper surface portion was converted into a film comprising amorphous silicon dioxide by oxidation through said single crystal sapphire upper film of said insulating layer on said base plate.

4. The substrate of claim 1, wherein each said insulating layer has a dielectric constant of from 3 to 4.

5. The substrate of claim 1, wherein each said sapphire film has a thickness of up to 20,000 Å.

6. The substrate of claim 1, wherein at least one of said at least one silicon dioxide films has a thickness of from 1,000 to 20,000 Å.

7. The substrate of claim 1, wherein at least one of said at least one amorphous silicon dioxide lower films has a predetermined pattern.

8. The substrate of claim 1 comprising a selectively patterned layer of single crystal silicon on the uppermost one of said at least one upper film of single crystal sapphire.

9. The substrate of claim 8, wherein said selectively patterned layer of single crystal silicon has a thickness between 0.3 to 3.0 microns.

10. The substrate of claim 1, wherein at least one of said at least one lower films of amorphous silicon dioxide has a dielectric constant of from 3 to 4.

11. The substrate of claim 1, wherein at least one of said single crystal sapphire films has a dielectric constant in the approximate range from 9 to 10.

12. The substrate of claim 1, wherein each said upper layer of amorphous silicon dioxide is the result of oxidation of a respective layer of single crystal silicon through a respective upper layer of single crystal sapphire formed on the respective single crystal silicon layer prior to said oxidation.

13. The substrate of claim 1, said epitaxial relation comprising said base plate, each said sapphire layer, and said layer of silicon crystal silicon having a respective crystal structure and orientation.

* * * * *

UNITED STATES PATENT AND TRADEMARK OFFICE
CERTIFICATE OF CORRECTION

PATENT NO. : 4,282,543

DATED : 4 August 1981

INVENTOR(S) : MASARU IHARA et al.

Page 1 of 2

It is certified that error appears in the above—identified patent and that said Letters Patent is hereby corrected as shown below:

Front page, [73] Assignee, "Kanagawa," should be
--Kawasaki,--;
    [56] References cited, "Manasevit" should be
--Manasevit et al.--;
    [57] Abstract, lines 5, 8, 9, 13 & 15,
"single crystal" should be --single-crystal--;
    line 5, "of single" should be
--of single---.

Col. 1, line 19, "base plate of a" should be --a base plate of--;

Col. 2, line 1, "°C." should be --°C--;
    line 6, delete "crystal";
    line 7, delete "of";
    lines 32, 35, 39, 41, 48, 52, 62, 67 & 67, "single crystal" should be --single-crystal--;
    line 40, at the end of the line, delete "of";
    line 53, "single crys" should be --single-crys---;
    line 57, "A additional" should be --Additional--.

Col. 3, lines 1, 3, 22, 23, "single crystal" should be --single-crystal--;

UNITED STATES PATENT AND TRADEMARK OFFICE
CERTIFICATE OF CORRECTION

PATENT NO. : 4,282,543
DATED : 4 August 1981         Page 2 of 2
INVENTOR(S) : MASARU IHARA et al.

It is certified that error appears in the above—identified patent and that said Letters Patent is hereby corrected as shown below:

```
          line 21, delete "of";
          line 32, "silicion" should be --silicon--;
          line 53, "single crys-" should be --single-crys---.
Col. 4,   line 7, "larger" should be --large--;
          lines 28, 36, 39, 49, 58, 60 & 61, "single crystal"
      should be --single-crystal--;
          line 30, "single" should be --single---;
          line 46, "C." should be --C--;
          line 60, delete "consisting".
Col. 5,   line 14, at the beginning of the line insert
      --aluminum--;
          lines 37 & 50, "single crystal" should be
      --single-crystal--;
          line 54, "single" should be --single---.
Col. 6,   lines 4, 17, 31, 32, 35, 41, 45, 46 & 47,
      "single crystal" should be --single-crystal--;
          lines 5 & 9, "single" should be --single---.
```

Signed and Sealed this

Nineteenth Day of January 1982

[SEAL]

Attest:

GERALD J. MOSSINGHOFF

Attesting Officer      Commissioner of Patents and Trademarks